US012620429B2

(12) United States Patent
Lu

(10) Patent No.: US 12,620,429 B2
(45) Date of Patent: *May 5, 2026

(54) SEMICONDUCTOR MEMORY, REFRESH METHOD AND ELECTRONIC DEVICE

(71) Applicant: CHANGXIN MEMORY TECHNOLOGIES, INC., Hefei City (CN)

(72) Inventor: Huan Lu, Hefei (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 746 days.

This patent is subject to a terminal disclaimer.

(21) Appl. No.: 17/953,405

(22) Filed: Sep. 27, 2022

(65) Prior Publication Data

US 2023/0017826 A1 Jan. 19, 2023

Related U.S. Application Data

(63) Continuation of application No. PCT/CN2022/098668, filed on Jun. 14, 2022.

(30) Foreign Application Priority Data

Apr. 8, 2022 (CN) .......................... 202210370026.X

(51) Int. Cl.
G11C 11/406 (2006.01)

(52) U.S. Cl.
CPC .................................. G11C 11/406 (2013.01)

(58) Field of Classification Search
CPC ............ G11C 11/406; G11C 11/40618; G11C 11/40615; G11C 11/4085

USPC ........................................................ 365/222
See application file for complete search history.

(56) References Cited

U.S. PATENT DOCUMENTS

| | | | |
|---|---|---|---|
| 6,977,847 | B2 | 12/2005 | Lasser |
| 10,490,250 | B1 | 11/2019 | Ito et al. |
| 10,572,377 | B1 | 2/2020 | Zhang |
| 2012/0317386 | A1 | 12/2012 | Driever |
| 2013/0103916 | A1 | 4/2013 | Driever et al. |

(Continued)

FOREIGN PATENT DOCUMENTS

| | | |
|---|---|---|
| CN | 101017448 A | 8/2007 |
| CN | 104317527 A | 1/2015 |

(Continued)

OTHER PUBLICATIONS

"JESD79-4B DDR4 SDRAM data sheet" (Revision of JESD79-4A, Nov. 2013) Jun. 2017, http://www.softnology.biz/pdf/JESD79-4B. pdf, 262 pages.

(Continued)

*Primary Examiner* — Connie C Yoha
(74) *Attorney, Agent, or Firm* — Syncoda LLC; Feng Ma

(57) ABSTRACT

A semiconductor memory, a refresh method and an electronic device are provided. The semiconductor memory includes a main storage area and a mark storage area, multiple storage rows are arranged in the main storage area, and multiple first flag bits are arranged in the mark storage area. Each storage row has a correspondence with one first flag bit, and the first flag bit is used for indicating whether the storage row is an aggressor row of a row hammer event.

7 Claims, 12 Drawing Sheets

(56)     References Cited

U.S. PATENT DOCUMENTS

| | | | |
|---|---|---|---|
| 2015/0242328 A1 | 8/2015 | Driever et al. | |
| 2017/0011792 A1 | 1/2017 | Oh et al. | |
| 2018/0158507 A1 | 6/2018 | Bang | |
| 2018/0196705 A1 | 7/2018 | Miller | |
| 2019/0056874 A1 | 2/2019 | Lee et al. | |
| 2020/0090750 A1 | 3/2020 | Zhang et al. | |
| 2020/0233608 A1 | 7/2020 | Kim | |
| 2023/0154521 A1* | 5/2023 | Kim | G11C 11/40611 |
| | | | 365/222 |
| 2025/0013746 A1* | 1/2025 | Kim | G11C 29/52 |
| 2025/0054533 A1* | 2/2025 | Eun | G11C 11/40603 |
| 2025/0191632 A1* | 6/2025 | Shin | G11C 11/40611 |

FOREIGN PATENT DOCUMENTS

| | | | |
|---|---|---|---|
| CN | 104636285 A | 5/2015 | |
| CN | 108154895 A | 6/2018 | |
| CN | 109408258 A | 3/2019 | |
| CN | 110827884 A | 2/2020 | |
| CN | 111177017 A | 5/2020 | |
| CN | 112106138 A | 12/2020 | |
| CN | 112767983 A | 5/2021 | |
| CN | 113282240 A | 8/2021 | |
| CN | 114093407 A | 2/2022 | |

OTHER PUBLICATIONS

US office action in U.S. Appl. No. 17/935,557, mailed on May 17, 2024.

* cited by examiner

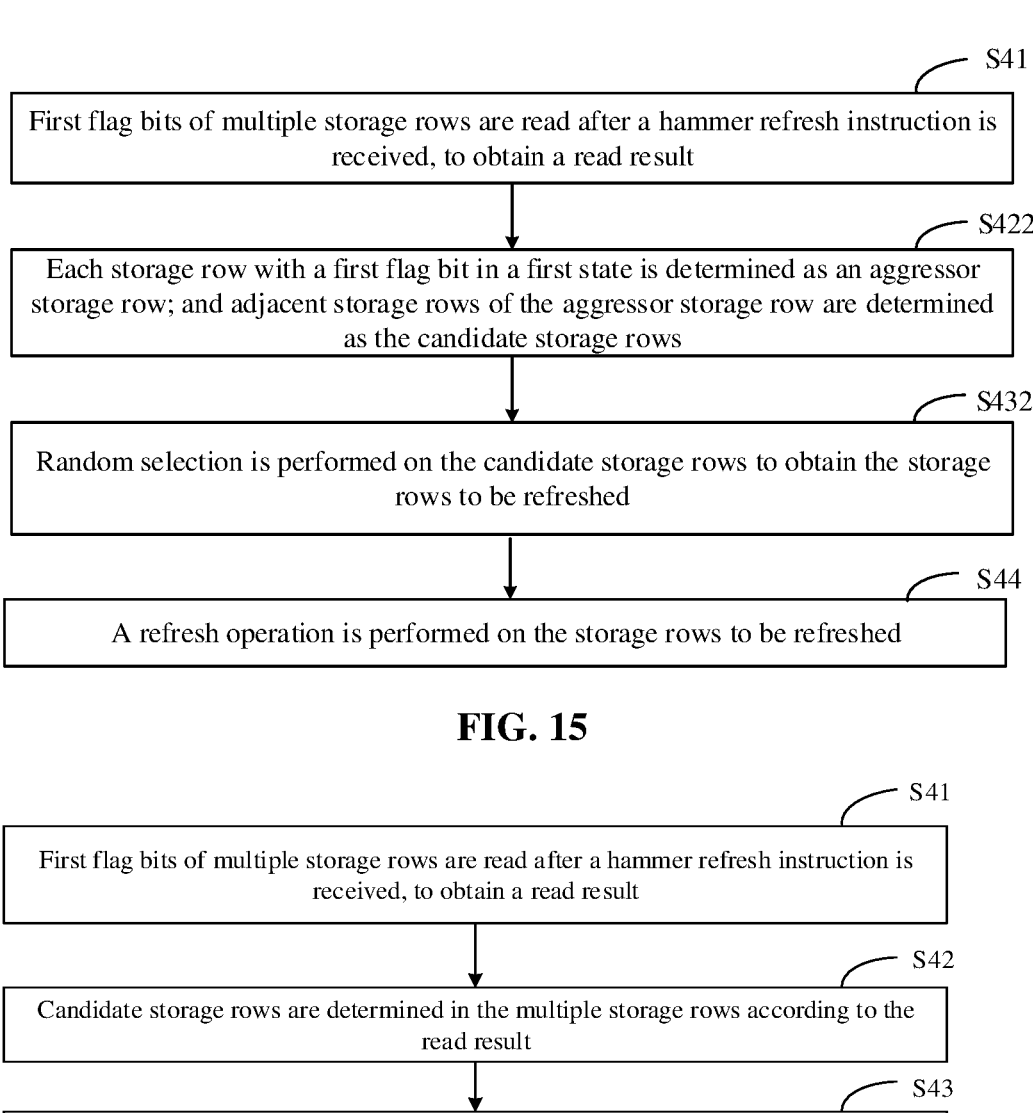

S41

First flag bits of multiple storage rows are read after a hammer refresh instruction is received, to obtain a read result

S422

Each storage row with a first flag bit in a first state is determined as an aggressor storage row; and adjacent storage rows of the aggressor storage row are determined as the candidate storage rows

S432

Random selection is performed on the candidate storage rows to obtain the storage rows to be refreshed

S44

A refresh operation is performed on the storage rows to be refreshed

First flag bits of multiple storage rows are read after a hammer refresh instruction is received, to obtain a read result

S42

Candidate storage rows are determined in the multiple storage rows according to the read result

S43

Storage rows to be refreshed are determined according to the candidate storage rows

S45

A second flag bit of a storage group including the storage rows to be refreshed is read In response to the second flag bit being in a third stat In response to the second flag bit being in a fourth state

S44

A refresh operation is performed on the storage rows to be refreshed

S461

No refresh operation is performed on the storage rows to be refreshed, and execution of the hammer refresh instruction is stopped

FIG. 16

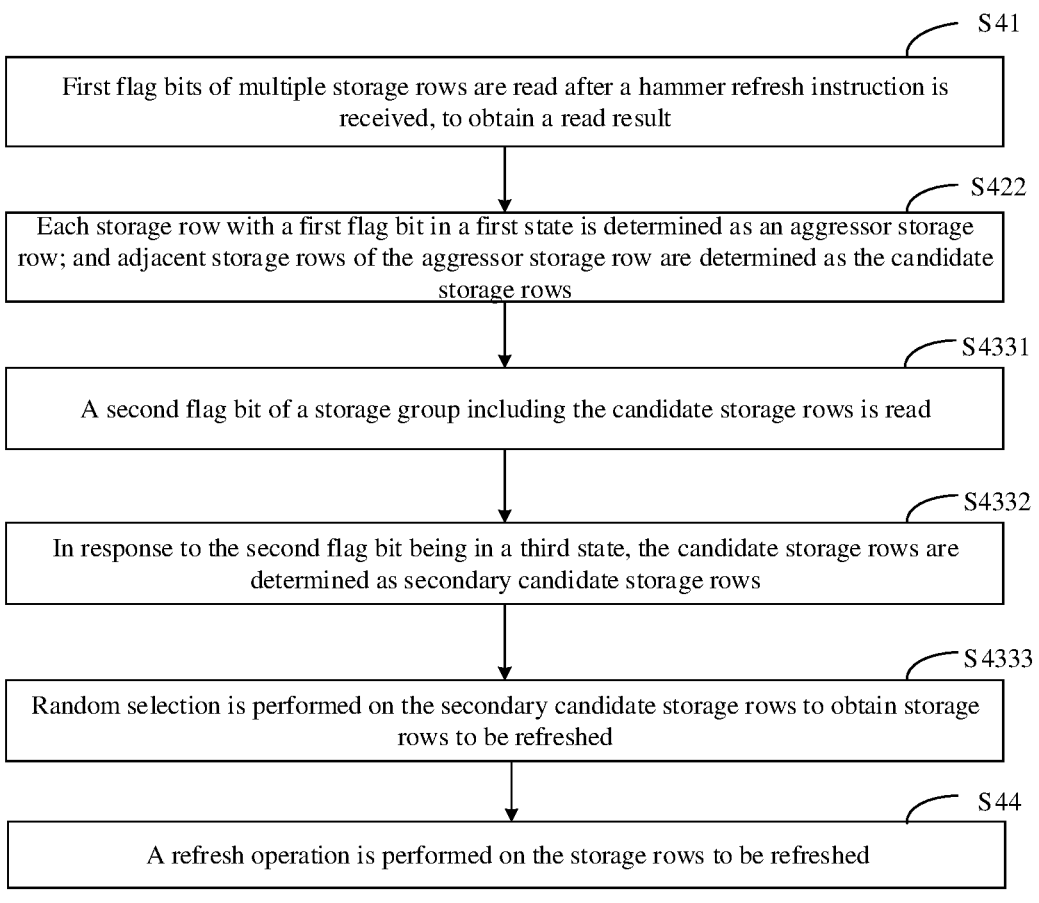

S41

First flag bits of multiple storage rows are read after a hammer refresh instruction is received, to obtain a read result

S422

Each storage row with a first flag bit in a first state is determined as an aggressor storage row; and adjacent storage rows of the aggressor storage row are determined as the candidate storage rows

S4331

A second flag bit of a storage group including the candidate storage rows is read

S4332

In response to the second flag bit being in a third state, the candidate storage rows are determined as secondary candidate storage rows

S4333

Random selection is performed on the secondary candidate storage rows to obtain storage rows to be refreshed

S44

A refresh operation is performed on the storage rows to be refreshed

FIG. 18

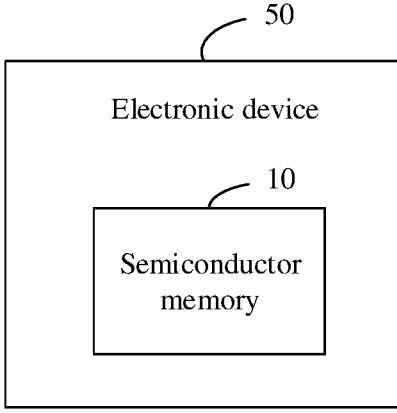

50

Electronic device

10

Semiconductor memory

FIG. 19

SEMICONDUCTOR MEMORY, REFRESH METHOD AND ELECTRONIC DEVICE

CROSS-REFERENCE TO RELATED APPLICATIONS

This is a continuation of International Patent Application No. PCT/CN2022/098668, filed on Jun. 14, 2022, which claims priority to Chinese patent application No. 202210370026.X, filed on Apr. 8, 2022 and entitled "SEMI-CONDUCTOR MEMORY, REFRESH METHOD AND ELECTRONIC DEVICE". The contents of International Patent Application No. PCT/CN2022/098668 and Chinese patent application No. 202210370026.X are incorporated herein by reference in their entireties.

BACKGROUND

Dynamic Random Access Memory (DRAM) is a semiconductor memory device commonly used in computers, which consists of multiple repeated memory cells, and different memory cells need to be selected through word lines and bit lines. That is, there are a large number of word lines in DRAM, which are arranged adjacent to each other. When a certain word line is subjected to a row hammer, memory cells on word lines adjacent to the word line may produce data errors. In order to solve the problem, it is necessary to refresh the word lines after the row hammer is detected. In such case, a refresh object is randomly determined, which results in insignificant mitigation on the row hammer attack and high power consumption.

SUMMARY

The present disclosure relates to the technical field of semiconductor memory, and provides a semiconductor memory, a refresh method and an electronic device, which may mark an aggressor row of a row hammer event through a first flag bit, so as to improve the handling effect of the row hammer event.

The technical solution of the present disclosure is realized as follows.

According to a first aspect, the embodiments of the present disclosure provide a semiconductor memory, which includes a main storage area and a mark storage area. Multiple storage rows are arranged in the main storage area, and multiple first flag bits are arranged in the mark storage area. Each storage row has a correspondence with one first flag bit, and the first flag bit is used for indicating whether the storage row is an aggressor row of a row hammer event.

According to a second aspect, the embodiments of the present disclosure provide a refresh method, which is applied to a semiconductor memory including multiple storage rows and multiple first flag bits, and one of the first flag bits is used for indicating whether one storage row is an aggressor row of a row hammer event. The method includes the following operations. A target storage row is randomly determined in the multiple storage rows after a hammer refresh instruction is received. A first flag bit of the target storage row is read to obtain a read result. It is determined according to the read result whether to perform a refresh operation on adjacent storage rows of the target storage row.

According to a third aspect, the embodiments of the present disclosure provide a refresh method, which is applied to a semiconductor memory including multiple storage rows and multiple first flag bits, and one of the first flag bits is used for indicating whether one storage row is an aggressor row of a row hammer event. The method includes the following operations. First flag bits of the multiple storage rows are read after a hammer refresh instruction is received, to obtain a read result. Candidate storage rows are determined in the multiple storage rows according to the read result. Storage rows to be refreshed are determined according to the candidate storage rows, and a refresh operation is performed on the storage rows to be refreshed.

According to a fourth aspect, the embodiments of the present disclosure provide an electronic device, which includes the semiconductor memory as described in the first aspect.

The embodiments of the present disclosure provide a semiconductor memory, a refresh method and an electronic device. The semiconductor memory includes a main storage area and a mark storage area, multiple storage rows are arranged in the main storage area, and multiple first flag bits are arranged in the mark storage area. Each storage row has a correspondence with one first flag bit, and the first flag bit is used for indicating whether the storage row is an aggressor row of a row hammer event.

BRIEF DESCRIPTION OF THE DRAWINGS

FIG. 15 is a third schematic flowchart of another refresh method according to an embodiment of the present disclosure.

FIG. 16 is a fourth schematic flowchart of another refresh method according to an embodiment of the present disclosure.

FIG. 18 is a sixth schematic flowchart of another refresh method according to an embodiment of the present disclosure.

FIG. 19 is a schematic diagram of a composition structure of an electronic device according to an embodiment of the present disclosure.

DETAILED DESCRIPTION

The technical solutions in the embodiments of the present disclosure will be clearly and completely described below in conjunction with the accompanying drawings in the embodiments of the present disclosure. It is to be understood that the specific embodiments described herein are merely intended to explain the relevant application and not to limit the application. It should also be noted that, for ease of description, only portions related to the related application are shown in the accompanying drawings.

Unless otherwise defined, all technical and scientific terms used herein have the same meaning as those generally understood by those skilled in the art belonging to the present disclosure. The terms used herein are only adopted to describe the embodiments of the disclosure and not intended to limit the disclosure.

In the following description, "some embodiments" involved describes a subset of all possible embodiments, but it is to be understood that "some embodiments" may be a same subset or different subsets of all possible embodiments and may be combined with each other without conflict.

It should be noted that the term "first\second\third" involved in the embodiments of the present disclosure is merely used to distinguish similar objects without representing a specific order for the objects. It is to be understood that "first\second\third" may be interchanged to specific sequences or orders if allowed to implement the embodiments of the disclosure described herein in sequences except the illustrated or described ones.

At present, for a volatile memory, since memory cells become denser and denser and a distance between storage rows becomes smaller and smaller, which causes an increase in capacitive coupling between adjacent storage rows. In such case, if a certain storage row (called as an aggressor row) is activated repeatedly, adjacent storage rows (also called as victim rows) may be subjected to electromagnetic interference, so that memory cells on the victim rows lose data before a next refresh operation is performed. The above situation is called as row hammer. The row hammer may cause data errors in a target memory area without accessing the target memory area, so it is necessary to regularly perform a refresh operation on storage rows adjacent to the aggressor row to prevent data errors.

Figure 1:
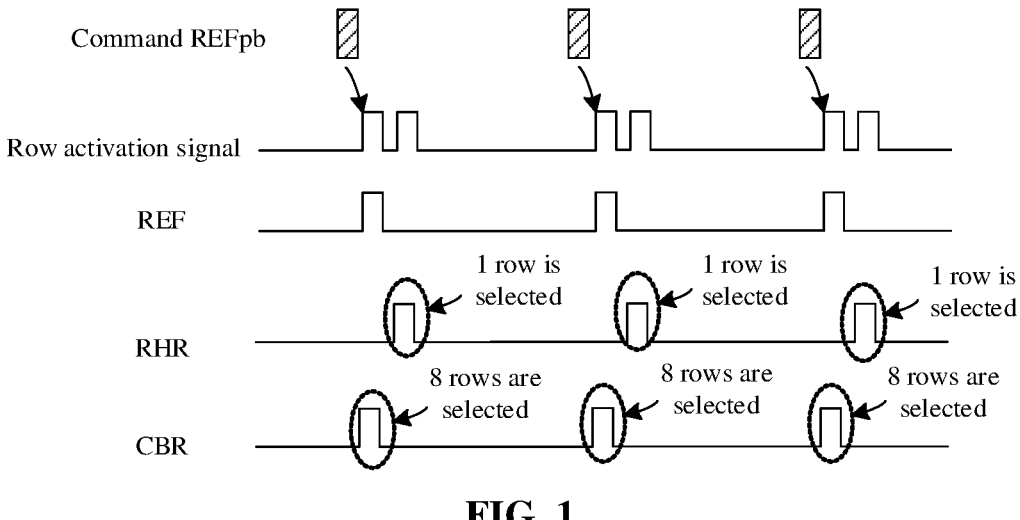
FIG. 1 is a schematic timing diagram of a refresh operation.

Specifically, when it is detected that a certain area is subjected to the row hammer, one word line selected randomly in the area needs to be refreshed. FIG. 1 illustrates a schematic timing diagram of a refresh operation. As shown in FIG. 1, after the memory receives a command REFpb, 8 rows (the number needs to be determined according to a specific refresh mechanism of the memory) of word lines are selected through an address selection signal CBR, the selected 8 rows of word lines are turned on through a row activation signal, and then an refresh operation is performed on the word lines in the turned-on state through a refresh signal REF, thereby completing one periodic refresh operation. After the memory receives a row hammer command (not shown in FIG. 1), one row of word line is selected randomly by a hammer refresh signal RHR, the selected word line is turned on by the row activation signal, and the refresh operation is performed on the word line in the turned-on state by the hammer refresh signal RHR, thereby completing one refreshed operation for the row hammer. That is, the semiconductor memory cannot accurately locate the attacked object when the semiconductor memory is subjected to the row hammer, and the handling effect is poor and the power consumption is high.

Based on the above, the embodiments of the present disclosure provide a semiconductor memory. Since a mark storage area is added in the semiconductor memory, an aggressor row of the row hammer event may be marked by the first flag bit to determine the attacked object of the row hammer, so that the handling effect of the row hammer event is improved and power consumption is reduced.

The embodiments of the present disclosure will be described in detail below with reference to the accompanying drawings.

Figure 2:
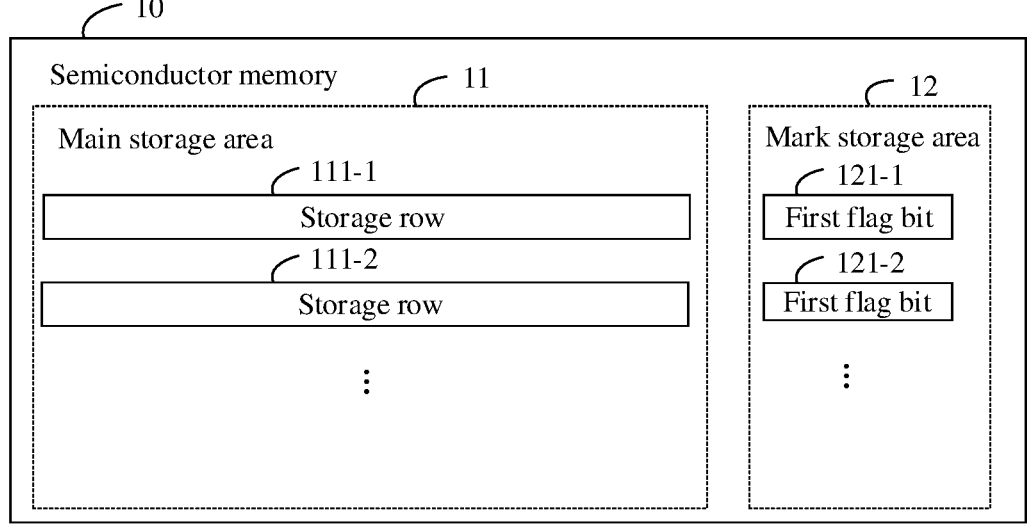
FIG. 2 is a schematic structural diagram of a semiconductor memory according to an embodiment of the present disclosure.

In an embodiment of the present disclosure, FIG. 2 illustrates a schematic structural diagram of a semiconductor memory 10 according to an embodiment of the present disclosure. As shown in FIG. 2, the semiconductor memory 10 includes a main storage area 11 and a mark storage area 12. Multiple storage rows (e.g., a storage row 111-1, a storage row 111-2 . . . in FIG. 1) are arranged in the main storage area 11, and multiple first flag bits (e.g., a first flag bit 121-1, a first flag bit 121-2 . . . in FIG. 1) are arranged in the mark storage area 12. Each storage row has a correspondence with one first flag bit, and the first flag bit is used for indicating whether the storage row is an aggressor row of a row hammer event.

It is to be noted that the semiconductor memory 10 may be a volatile memory, such as DRAM.

In the embodiments of the present disclosure, the mark storage area 12 is added in the semiconductor memory 10 to record whether each storage row in the main storage area 11 is an aggressor row in the row hammer event, so that the attacked object of the row hammer event may be accurately located, thereby improving the handling effect of the row hammer event.

In some embodiments, a portion of each storage row extending to the mark storage area is used for forming a first flag bit corresponding to the storage row. The first flag bit occupies a memory cell.

Figure 3:
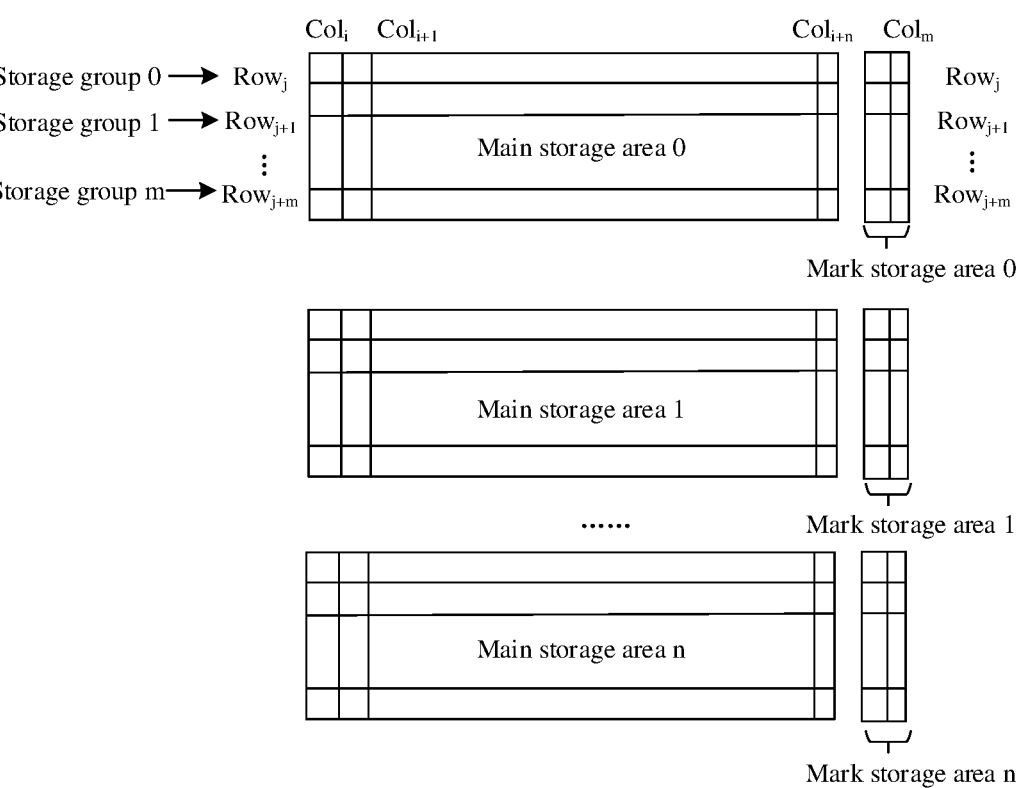
FIG. 3 is a first schematic diagram of a specific structure of a semiconductor memory according to an embodiment of the present disclosure.

Exemplarily, FIG. 3 illustrates a schematic structural diagram of another semiconductor memory according to an embodiment of the present disclosure. In FIG. 3, the semi-conductor memory includes multiple different storage banks, one portion of each storage bank belongs to the main storage area (e.g., a main storage area 0, a main storage area 1, . . . , a main storage area n in FIG. 3), and the other portion of each storage bank belongs to the mark storage area (e.g., a mark storage area 0, a mark storage area 1, . . . , a mark storage area n in FIG. 3). In FIG. 3, each storage row (or called as a word line) is represented by Row, each storage column (or called as a bit line) is represented by Col, and subscript of the storage row or storage column represents a serial number. In the embodiments of the present disclosure, each serial number is only used to identify the respective storage row or storage column, and do not constitute any location limitation. In addition, the intersection of each storage row and storage column may be regarded as existence of a memory cell.

As shown in FIG. 3, the storage row $Row_j$ and the bit line $Col_m$ form a first flag bit of the storage row $Row_j$, and the storage row $Row_{j+1}$ and the bit line Colm form a first flag bit of the storage row $Row_{j+1}$, . . . , others may be understood by reference. Thus, the first flag bit in the mark storage area shares the same storage row with the main storage area. In other embodiments, the main storage area and the mark storage area may be two relatively independent areas, and the flag bit in the mark storage area does not share the same storage row with the main storage area.

It is to be noted that, as shown in FIG. 2 or FIG. 3, there is no specific position relationship between the main storage area 11 and the mark storage area 12. For example, the mark storage area 12 may be arranged outside the main storage area 11. Taking the storage row $Row_j$ as an example, the bit line $Col_m$ is located on the side of the bit line $Col_i$ away from the bit line $Col_{i+n}$, or the bit line $Col_m$ is located on the side of the bit line $Col_{i+n}$ away from the bit line $Col_i$. For another example, the mark storage area 12 may be arranged inside the main storage area 11. Taking the storage row $Row_j$ as an example, the bit line $Col_m$ is located between the bit line $Col_i$ and the bit line $Col_{i+n}$.

It is also to be noted that one storage bank may be provided with 1024 bit lines belonging to the main storage area and one bit line belonging to the mark storage area. That is, a ratio of bit lines in the main storage area 11 to that in the mark storage area 12 is 1024:1, and an area ratio of the mark storage area 12 is less than 0.1%, so the influence of arranging the mark storage area 12 on the chip area is very small.

In some embodiments, the semiconductor memory 10 is configured to adjust, in response to monitoring that a number of consecutive accesses to a storage row within a unit time exceeds a preset threshold, a first flag bit of the storage row to a first state; or, adjust, after performing a refresh operation on one or more adjacent storage rows of the storage row, the first flag bit of the storage row to a second state, and reaccumulate the number of consecutive accesses to the storage row within the unit time.

Figure 4:
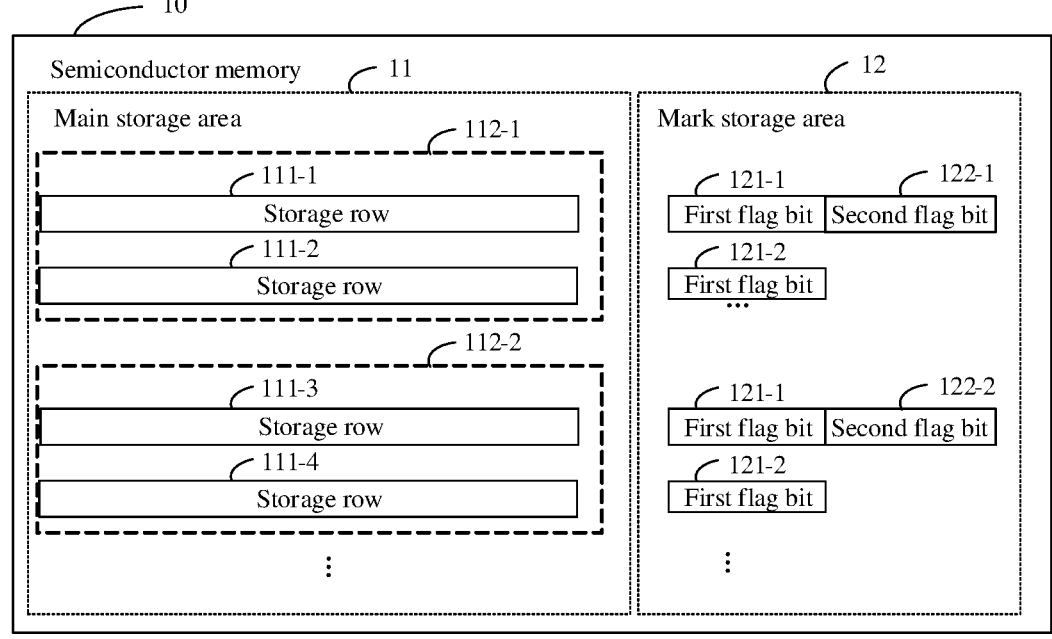
FIG. 4 is a schematic structural diagram of another semiconductor memory according to an embodiment of the present disclosure.

As shown in FIG. 4, in some embodiments, the multiple storage rows are divided into multiple storage groups (e.g., a storage group 112-1, a storage group 112-2 in FIG. 4), and multiple second flag bits (e.g., a second flag bit 122-1, a second flag bit 122-2 in FIG. 4) are also arranged in the mark storage area 12. Each storage group has a correspondence with one second flag bit, and the second flag bit is at least used for indicating whether at least one memory cell in each storage group has a specific state. The specific state includes an occupancy state.

It is to be noted that the number of storage rows included in each storage group needs to be determined according to the actual application scenario. The number of storage rows in each storage group is theoretically the same, and may also be different under special conditions. It is to be understood that, in FIG. 4, each storage group includes two storage rows, but there may be more or fewer storage rows in a practical application scenario. The second flag bit is used for recording state information of the storage group.

The specific state at least includes an occupancy state, and may also include a damage state, a locking state, a releasing state and so on. In addition, in different application scenarios, the occupancy state of the memory cell may have different definitions. For example, the occupancy state means that the memory cell is allocated to a user for use without storing valid data, or the occupancy state means that there is valid data stored in the memory cell.

It is to be understood that, when each storage row has one second flag bit, it is able to accurately know whether a victim row is occupied in the row hammer event; and when each storage group including multiple storage rows corresponds to one second flag bit, it is possible to only know that the victim row may be occupied. If the victim row is occupied, it is necessary to perform the refresh operation on the victim row to prevent data loss. If the victim row is not occupied, there is no need to perform the refresh operation on the victim row, thereby saving the power consumption. When the victim row may be occupied, it is also necessary to perform the refresh operation on the victim row.

It is to be understood that there is no restriction between the positions of the first flag bits and the positions of the second flag bits. For example, the first flag bit may be adjacent to the second flag bit, or the mark storage area 12 may be divided into two completely independent areas, one area is used for forming the first flag bits and the other area is used for forming the second flag bits.

In some embodiments, each storage group includes one storage row, and a portion of the storage row extending to the mark storage area is used for forming a second flag bit corresponding to the storage group.

Figure 5:
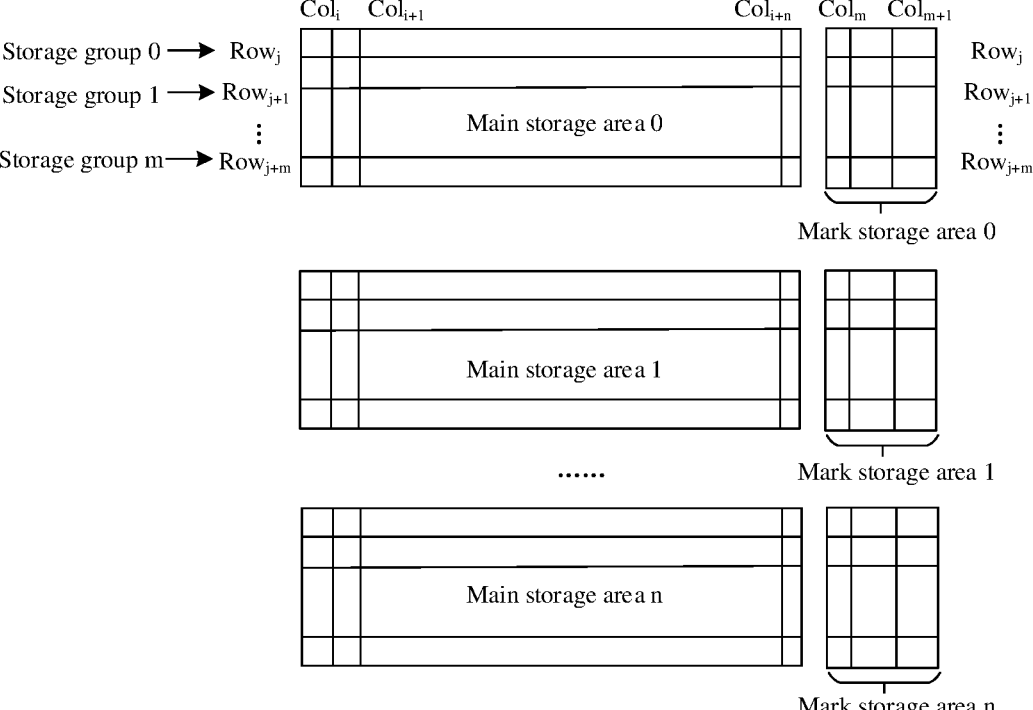
FIG. 5 is a second schematic diagram of a specific structure of a semiconductor memory according to an embodiment of the present disclosure.

It is assumed that the second flag bit occupies one memory cell, a specific description is made by taking FIG. 5 as an example. The memory cells formed by the storage row $Row_j$ and the bit lines $Col_i$~$Col_{i+n}$ form one storage group, and the storage row $Row_j$ and the bit line $Col_{m+1}$ form the second flag bit of the storage group. The memory cells formed by the storage row $Row_{j+1}$ and the bit lines $Col_i$~$Col_{i+n}$ form another storage group, and the storage row $Row_{j+1}$ and the bit line $Col_{m+1}$ form the second flag bit of the storage group.

In other embodiments, each storage group includes multiple storage rows, and a portion of one of the storage rows extending to the mark storage area is used for forming a second flag bit corresponding to the storage group.

Figure 6:
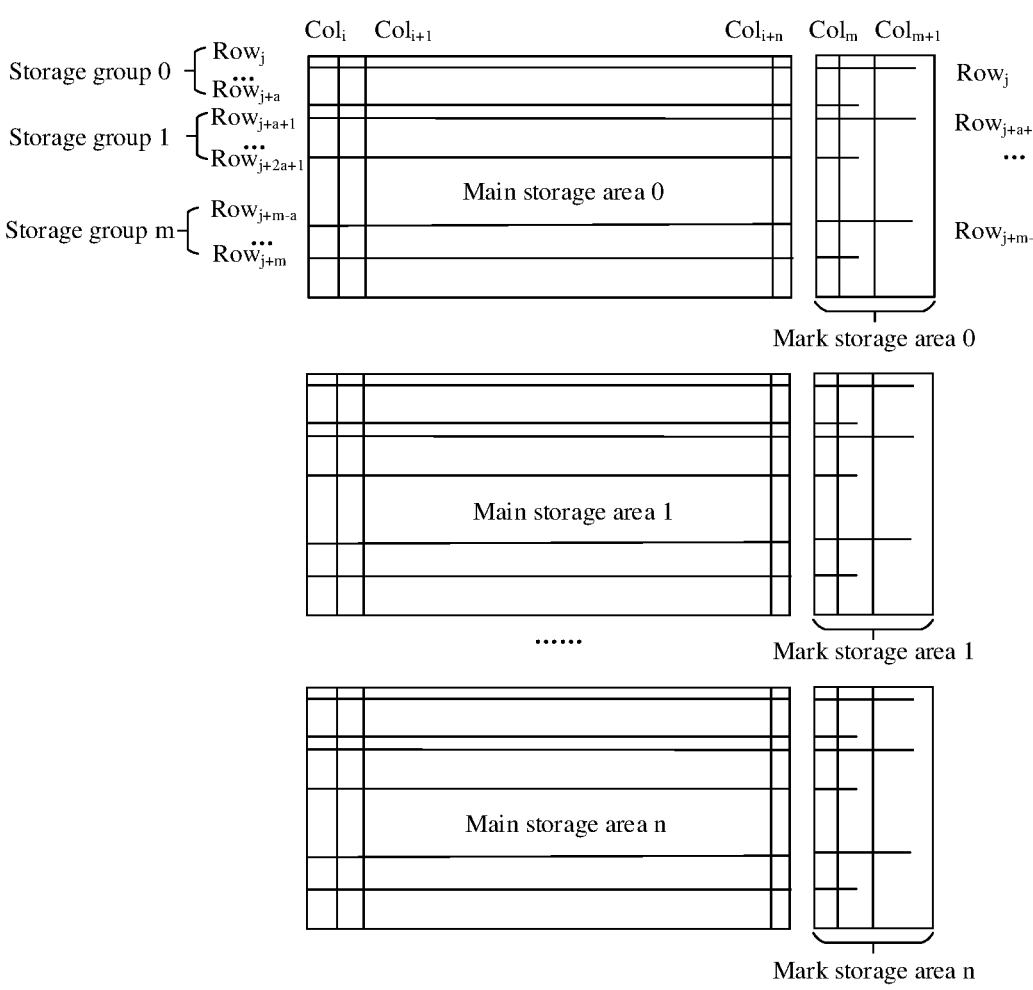
FIG. 6 is a third schematic diagram of a specific structure of a semiconductor memory according to an embodiment of the present disclosure.

It is assumed that the second flag bit occupies one memory cell, a specific description is made by taking FIG. 6 as an example. The memory cells formed by the storage rows $Row_j$~$Row_{j+a}$ and the bit lines $Col_i$~$Col_{i+n}$ form one storage group, and the storage row $Row_j$ and the bit line $Col_{m+1}$ form the second flag bit of the storage group. The memory cells formed by the storage row $Row_{j+a+1}$~$Row_{j+2a+1}$ and the bit lines $Col_i$~$Col_{i+n}$ form another storage group, and the storage row $Row_{j+a+1}$ and the bit line $Col_{m+1}$ form the second flag bit of the storage group. Others may be understood by reference.

In addition, in FIG. 6, in order to avoid waste of the storage space, the storage rows $Row_{j+a+2}$~$Row_{j+2a+1}$ and the bit line $Col_{m+1}$ also form corresponding memory cells, which may belong to the main storage area.

Thus, as shown in FIG. 5 or FIG. 6, the second flag bit in the mark storage area and the main storage area also share the same storage row. In other embodiments, the second flag bit in the mark storage area does not share the same storage row with the main storage area.

It is to be noted that, as shown in FIG. 5 or FIG. 6, the bit line $Col_m$ and the bit line $Col_{m+1}$ in the mark storage area may be arranged on the same outside of the main storage area; or, the bit line $Col_m$ and the bit line $Col_{m+1}$ may be arranged on opposite sides of the main storage area. In such case, the first flag bits and the second flag bits may not only play the role of identification, but also play the role of protecting the storage groups, that is, when the storage bank is damaged, the mark storage area, not the main storage area, will be damaged preferentially, thereby ensuring the effectiveness of basic functions. Alternatively, the bit line $Col_m$ and the bit line $Col_{m+1}$ may be arranged inside the main storage area. In such case, when the storage bank is damaged, the main storage area, not the mark storage area, will be damaged preferentially, but the main storage area is generally provided with a redundant area for damage replacement to avoid the main storage area from not working. In some embodiments, the redundant area may also be used to replace the mark storage area to ensure the effectiveness of the mark function.

It is to be noted that, when the specific state include at least two states, each second flag bit includes at least two identifiers and different identifiers are used for indicating different specific states. Each identifier occupies one memory cell. That is, one second flag bit may occupy more memory cells, depending on the type of the specific state.

It is to be understood that the number of bit lines in the mark storage area 12×the number of storage rows in each storage group≥the number of identifiers, and the number of identifiers is equal to the sum of the number of storage rows in each storage group and the number of specific states represented by the second flag bits. Specifically, in a case where each storage group includes one storage row, there may be at least three bit lines in the mark storage area 12, so that portions of each storage row extending to the mark storage area may form at least two identifiers in the first flag bit and the second flag bit. Or, in a case where each storage group includes two storage rows, there may be at least two bit lines in the mark storage area 12, so that a portion of each storage row in each storage group extending to the mark storage area 12 may form a first flag bit with a first bit line in the mark storage area 12, and portions of at least two storage rows in each storage group extending to the mark storage area 12 may form at least two identifiers in the second flag bit with a second bit line in the mark storage area 12.

In some embodiments, the state of the second flag bit may be defined using existing instructions/operations in the DRAM. Exemplarily, the semiconductor memory 10 is also configured to adjust, after receiving a memory allocation instruction for a memory cell, a second flag bit of a storage group including the memory cell to a third state, and the memory allocation instruction may be a word line activation instruction Active. Or, the semiconductor memory 10 is also configured to adjust, after performing a refresh operation on the storage group, the second flag bit of the storage group to a fourth state.

Thus, after receiving the word line activation instruction Active, the semiconductor memory 10 activates a designated storage row and adjust the second flag bit corresponding to the storage row to the third state. In addition, after receiving the refresh instruction, the semiconductor memory 10, after performing a refresh operation on a certain storage group, adjusts the second flag bit of the storage group to the fourth state. Therefore, there is no need to define additional state control instructions for the second flag bit, thereby saving the signaling resource.

In other embodiments, the state of the second flag bit may be constructed based on the function of memory request/memory release in the DRAM. Exemplarily, the semiconductor memory 10 is also configured to adjust, after receiving the memory allocation instruction for the memory cell, the second flag bit of the storage group including the memory cell to the third state. The memory allocation instruction is constructed by using a first reserved code in a memory controller. Or, the semiconductor memory 10 is also configured to adjust, after receiving a memory release instruction for the storage group, the second flag bit of the storage group to the fourth state. The memory release instruction is constructed by using a second reserved code in the memory controller.

It is to be understood that there are several mode registers in the semiconductor memory 10, operands (OPs) in each mode register are used for providing different control functions, some general operands are specified by industry standards, and there are several reserved for use (RFU) codes that are not enabled in the mode register. In such case, a new Allocate instruction may be constructed as the memory allocation instruction and a new Release instruction may be constructed as memory release instruction through these RFU codes.

Therefore, in the working process of the semiconductor memory, part of the memory may be requested through the memory allocation instruction Allocate, and the second flag bit of the storage group corresponding to the requested memory area is adjusted to the third state based on the memory allocation instruction Allocate. Correspondingly, part of the memory may be released through the memory release instruction Release, and the second flag bit of the storage group corresponding to the released memory area is adjusted to the fourth state based on the memory release instruction. In this way, it is beneficial to adjust the state of the standard bit more accurately, and ensure the accurate execution of the refresh operation.

In other embodiments, the semiconductor memory 10 is also configured to adjust, after receiving the memory allocation instruction for the memory cell, the second flag bit of the storage group including the memory cell to the third state, and the memory allocation instruction is the word line activation instruction Active. Or, the semiconductor memory 10 is configured to adjust, after receiving the memory release instruction for the storage group, the second flag bit of the storage group to the fourth state, and the memory release instruction is constructed by using the second reserved code in the memory controller. In this way, after the memory cell is activated and before the memory cell is released, the corresponding second flag bit is always in the third state, which is not affected by the refresh operation, thereby reducing the adjustment frequency of the second flag bit corresponding to the storage group and reducing the power consumption.

In the foregoing description, the first state refers to that data 1 is stored in the first flag bit, and the second state refers to that data 0 is stored in the first flag bit. Or, the first state refers to that that data 0 is stored in the first flag bit, and the second state refers to that data 1 is stored in the first flag bit.

The third state refers to that data 1 is stored in the second flag bit (or the corresponding identifier in the second flag bit), and the fourth state refers to that data 0 is stored in the second flag bit (or the corresponding identifier in the second flag bit). Or, the third state refers to that data 0 is stored in the second flag bit (or the corresponding identifier in the second flag bit), and the fourth state refers to that data 1 is stored in the second flag bit (or the corresponding identifier in the second flag bit).

The embodiments of the present disclosure provide a novel storage structure. The mark storage area is added in the semiconductor memory. The first flag bit may mark the aggressor row of the row hammer event, and the second flag bit may indicate clearly whether at least one adjacent storage row of the aggressor row is occupied, and then it is determined whether to perform the refresh operation on the at least one adjacent storage row, so that the handling effect of the row hammer event is improved and power consumption is reduced.

Figure 7:
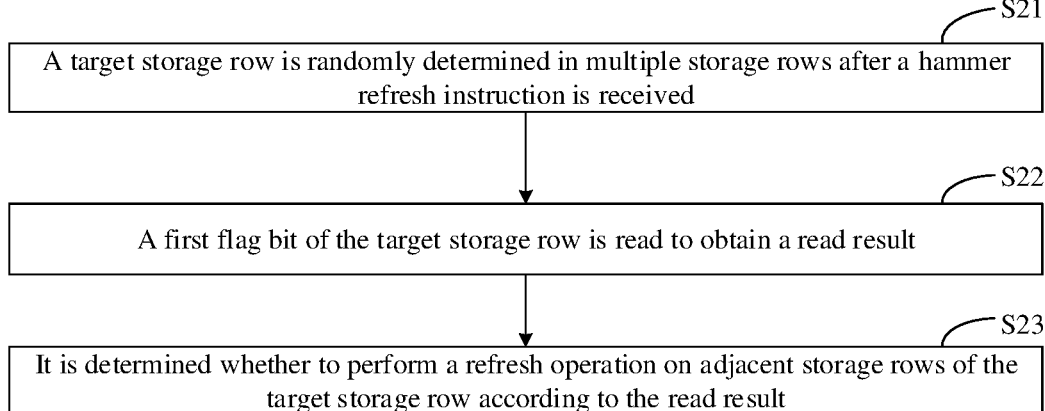
FIG. 7 is a first schematic flowchart of a refresh method according to an embodiment of the present disclosure.

In another embodiment of the present disclosure, FIG. 7 illustrates a schematic flowchart of a refresh method according to an embodiment of the present disclosure. As shown in FIG. 7, the method may include the following operations.

In S21, a target storage row is randomly determined in multiple storage rows after a hammer refresh instruction is received.

In S22, a first flag bit of the target storage row is read to obtain a read result.

In S23, it is determined whether to perform a refresh operation on adjacent storage rows of the target storage row according to the read result.

It is to be noted that, the refresh method provided by the embodiment of the present disclosure is applied to a semiconductor memory including the multiple storage rows and multiple first flag bits. One first flag bit is associated with one storage row, and the first flag bit is used for indicating whether the storage row is an aggressor row of a row hammer event, which can be specifically referred to in FIG. 2 or FIG. 3.

In particular, in the embodiments of the present disclosure, "random" is a macroscopic concept, which also includes some pseudo-random mechanisms.

The target storage row is marked as the ith row, and the adjacent storage row may be one row randomly selected from the (i+a)th storage row to the (i–a)th storage row. Or, the adjacent storage rows may be all of rows from the (i+a)th storage row to the (i–a)th storage row. a and i are positive integers. Generally, i is less than or equal to 3.

In this way, the embodiments of the present disclosure provide a row hammer refresh method with low power consumption. After the hammer refresh instruction is received, it is possible to know whether the target storage row is subjected to the row hammer through the first flag bit of the target storage row, and then determine whether to perform the refresh operation on the adjacent storage rows of the target storage row, so that the handling effect of the row hammer event is improved and power consumption is reduced.

Figure 8:
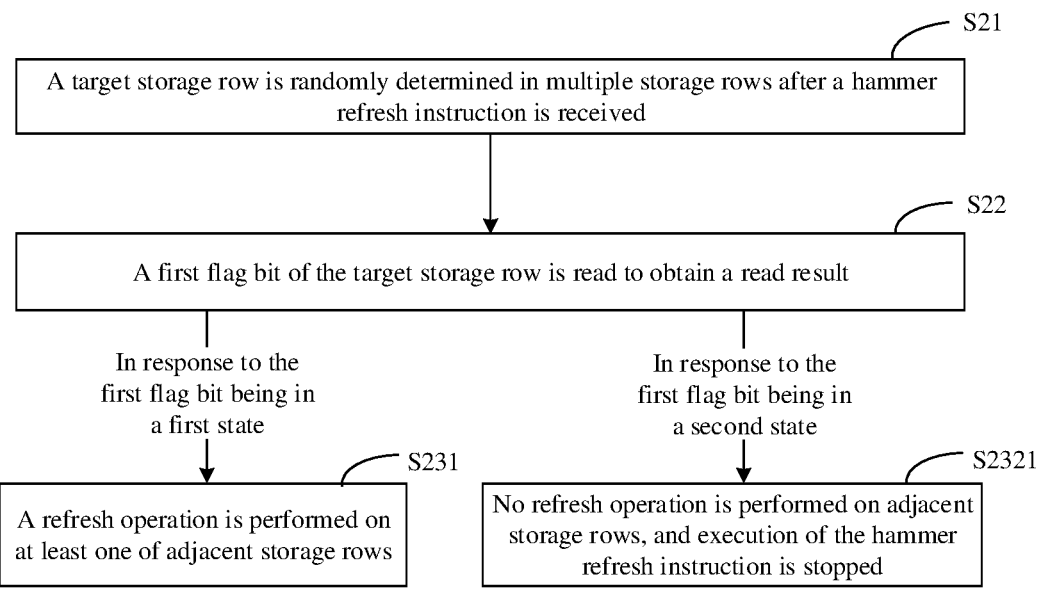
FIG. 8 is a second schematic flowchart of a refresh method according to an embodiment of the present disclosure.

In some embodiments, as shown in FIG. 8, for the operation in S22, in response to the first flag bit being in the first state, the operation in S231 is performed. In response to the first flag bit being in the second state, the operation in S2321 is performed.

In S231, the refresh operation is performed on at least one of the adjacent storage rows.

In S2321, no refresh operation is performed on the adjacent storage rows, and execution of the hammer refresh instruction is stopped.

Figure 9:
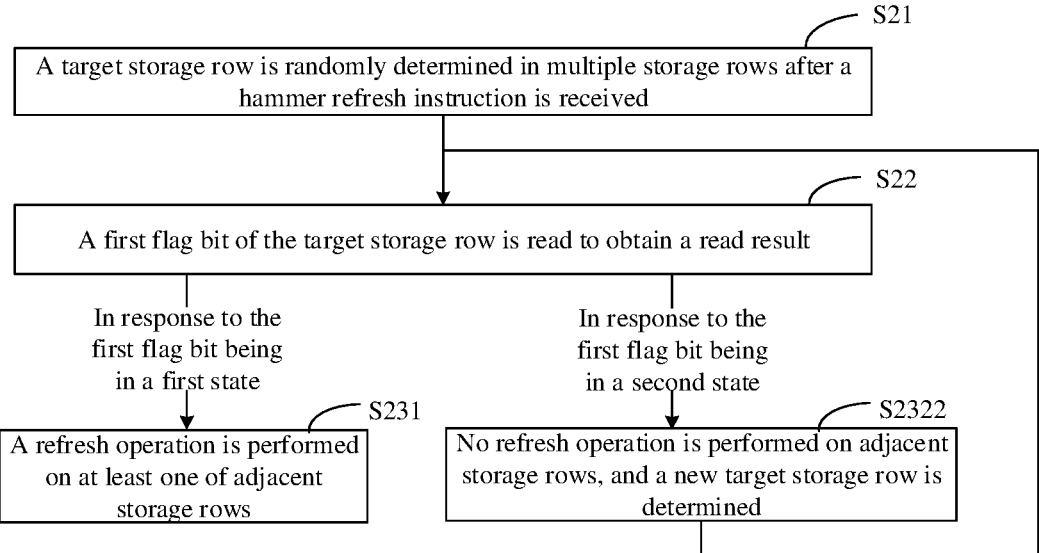
FIG. 9 is a third schematic flowchart of a refresh method according to an embodiment of the present disclosure.

In other embodiments, as shown in FIG. 9, for the operation in S22, in response to the first flag bit being in the second state, the operation in S2322 may also be performed.

In S2322, no refresh operation is performed on the adjacent storage rows, a new target storage row is determined, and the processing returns to and performs the operation in S22.

That is, when the first flag bit is in the first state, it indicates that the target storage row is the aggressor row in the row hammer event, and the refresh operation needs to be performed on the adjacent storage rows. When the first flag bit is in the second state, it indicates that the target storage row is not subjected to the row hammer, and no refresh operation needs to be performed on the adjacent storage rows, thereby saving the power consumption. Further, in a case where no refresh operation is performed on the adjacent storage rows, there may be at least two different processing mechanisms: (1) waiting, referring to the operation in S2321; and (2) skipping, referring to the operation in S2322.

It is to be noted that when determining the new target storage row, random determination of the target storage row may be performed again in the multiple storage rows, and the next storage row or the previous storage row of the original target storage row may also be determined as the new target storage row.

In some embodiments, the method also includes the following operations. After it is monitored that a number of consecutive accesses to a storage row within a unit time exceeds a preset threshold, a first flag bit of the storage row is adjusted to the first state. After the refresh operation is performed on the at least one of adjacent storage rows, the first flag bit of the storage row is adjusted to the second state, and the number of consecutive accesses to the storage row within the unit time is reaccumulated.

In some embodiments, as shown in FIG. 4 to FIG. 6, the semiconductor memory also includes second flag bits, the multiple storage rows are divided into multiple storage groups, one second flag bits has a correspondence with one storage group, and the second flag bit is at least used for indicating whether at least one memory cell in the storage group is in a specific state. The specific state includes an occupancy state.

Figure 10:
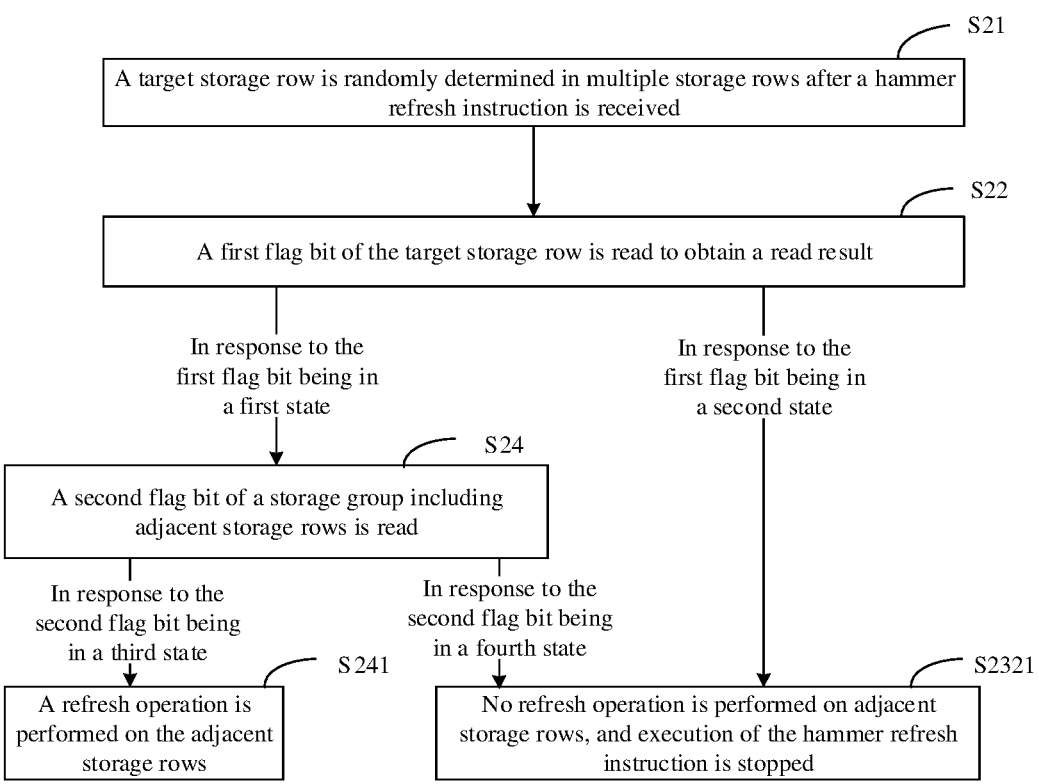
FIG. 10 is a fourth schematic flowchart of a refresh method according to an embodiment of the present disclosure.

Thus, as shown in FIG. 10, in response to the first flag bit of the target storage row being in the first state, the method also includes the following operations.

In S24, a second flag bit of a storage group including the adjacent storage rows is read.

Here, for the operation in S24, in response to the second flag bit being in the third state, the operation in S241 is performed. In response to the second flag bit being in the fourth state, the operation in S2321 is performed.

In S241, the refresh operation is performed on the adjacent storage rows. It is to be understood that the operation in S241 may also be adjusted to perform the refresh operation on at least one of the adjacent storage rows, and the adjacent storage row that is actually refreshed may be determined in a random manner, that is, it is unnecessary to perform the refresh operation on all the defined adjacent storage rows (a adjacent rows of the target storage row).

In S2321, no refresh operation is performed on the adjacent storage rows, and execution of the hammer refresh instruction is stopped.

Figures 11, 12A:
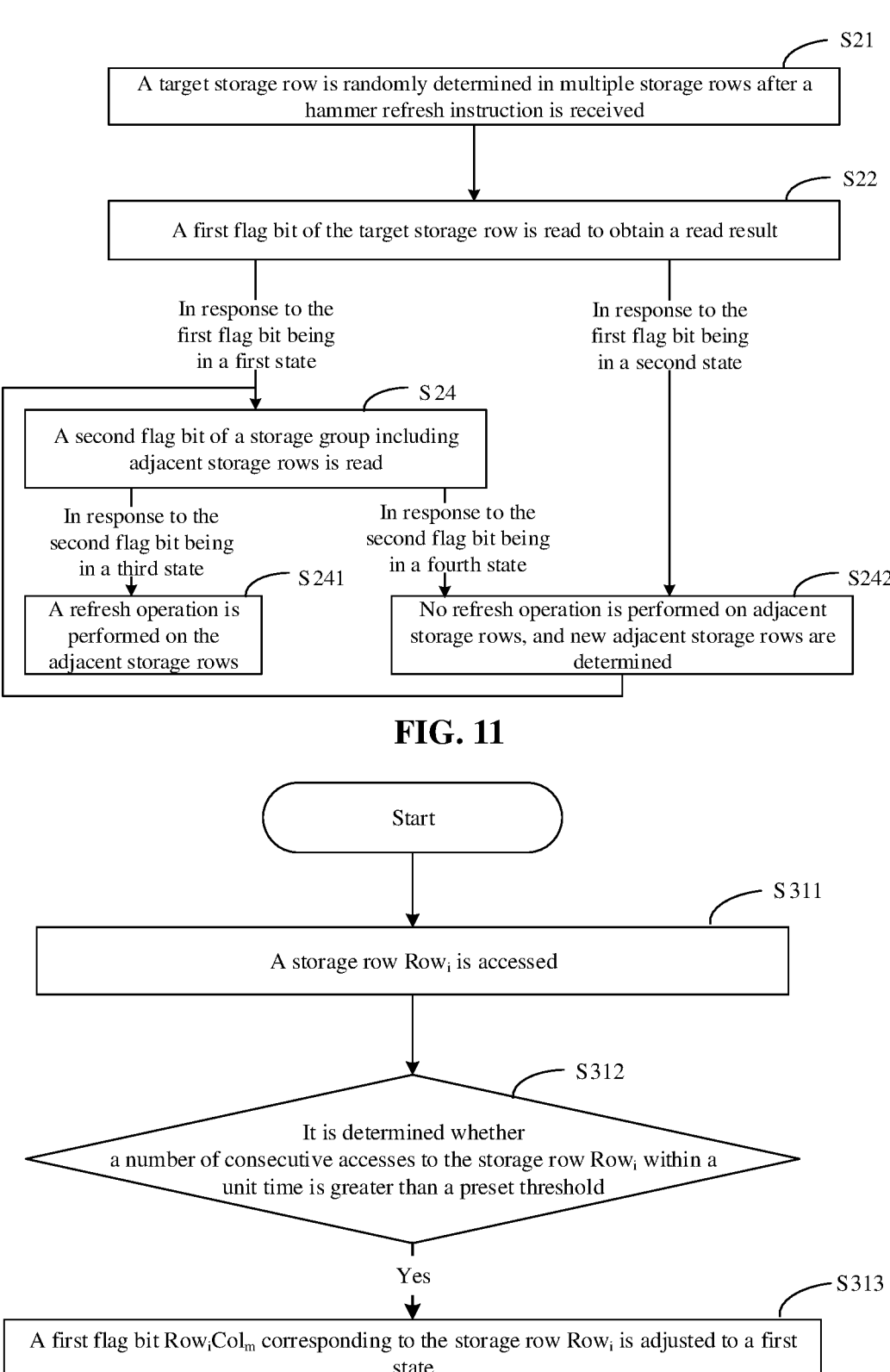
FIG. 11 is a fifth schematic flowchart of a refresh method according to an embodiment of the present disclosure.
FIG. 12A is a sixth schematic flowchart of a refresh method according to an embodiment of the present disclosure.

In other embodiments, as shown in FIG. 11, for the operation in S24, in response to the second flag bit being in the fourth state, the operation in S242 may also be performed.

In S242, no refresh operation is performed on the adjacent storage rows, one or more new adjacent storage rows are determined, and the processing returns to and performs the operation in S24.

It is to be noted that, when the second flag bit is in the third state, it indicates that the adjacent storage rows may be occupied, and the refresh operation needs to be performed on the adjacent storage rows. When the second flag bit is in the fourth state, it indicates that the adjacent storage rows must not be occupied, and no refresh operation needs to be performed on the adjacent storage rows, thereby saving the power consumption. Further, in a case where no refresh operation is performed on the adjacent storage rows, there may be at least two different processing mechanisms: (1) waiting, referring to the operation in S2321; and (2) skipping, referring to the operation in S242.

When the adjacent storage rows are all rows from the (a+i)th storage row to the (a−i)th storage row, the "waiting" or "skipping" mechanism will be performed only when the respective second flag bits of the (a+i)th storage row to the (a−i)th storage row are all in the fourth state. Further, for the "skipping" mechanism, it is necessary to determine a new target storage row in the remaining storage rows, and determine adjacent storage rows of the new target storage row as the new adjacent storage rows.

When the adjacent storage row is one row randomly determined from the (a+i)th storage row to the (a−i)th storage row, the "waiting" or "skipping" mechanism will be performed when the second flag bit of the storage row randomly determined is in the fourth state. Further, for the "skipping" mechanism, the new adjacent storage row may be randomly determined from the (a+i)th storage row to the (a−i)th storage row (of the original target storage row). In particular, when the second flag bits of the (a+i)th storage row to the (a−i)th storage row (of the original target storage row) are all in the fourth state, it is necessary to determine the new target storage row, and determine the adjacent storage row of the new target storage row as the new adjacent storage row.

That is, for the "waiting" mechanism, each hammer refresh instruction does not necessarily generate the refresh operation; and for the "skipping" mechanism, each hammer refresh instruction must generate the refresh operation. In addition, there may be the following special situations in the semiconductor memory: only the storage row 0 is the aggressor row in the row hammer event, and all adjacent rows of the storage row 0 are not occupied, and in such case, there is actually no "adjacent storage row" in the semiconductor memory that needs to be refreshed, for the "skipping" mechanism, this may cause the semiconductor memory unable to stop the hammer refresh instruction, or it may be determined that the adjacent storage rows of several consecutive target storage rows do not need to be refreshed, which causes too long execution time of the hammer refresh command. Therefore, for the semiconductor memory adopting the "skipping" mechanism, an auxiliary termination mechanism may also be provided: even if no refresh processing is performed within a certain time after the hammer refresh instruction is received, the hammer refresh instruction is regarded to be completed.

In some embodiments, the method also includes the following operations. After a memory allocation instruction is received, a second flag bit of a storage group corresponding to the memory allocation instruction is adjusted to the third state. After the refresh operation is performed on the storage group, the second flag bit of the storage group is adjusted to the fourth state. In such case, the memory allocation instruction may be a word line activation instruction Active.

It is to be noted that the refresh operation/processing may be performed according to the hammer refresh instruction mentioned above or may be performed according to other instructions (e.g., a periodic refresh instruction).

In other embodiments, the method also includes the following operations. After a memory allocation instruction is received, a second flag bit of a storage group corresponding to the memory allocation instruction is adjusted to the third state, or after a memory release instruction is received, a second flag bit of a storage group corresponding to the memory release instruction is adjusted to the fourth state. In such case, the memory allocation instruction is Allocate instruction constructed by using the first reserved code, and the memory release instruction is Release instruction constructed by using the second reserved code.

In other embodiments, the method also includes the following operations. After a memory allocation instruction for the memory cell is received, a second flag bit of a storage group to which the memory cell belongs is adjusted to the third state; or, after the refresh operation is performed on the storage group, the second flag bit of the storage group is adjusted to the fourth state. In such case, the memory allocation instruction may be the word line activation instruction Active.

Thus, the embodiments of the present disclosure provide a novel hammer refresh method, which may accurately locate the attacked object in the hammer refresh process, and perform no refresh operation on storage rows in the memory bank that have never been accessed (i.e., never been occupied), thereby improving the handling effect of row hammer event and reducing the refresh power consumption. In addition, the refresh method provided by the embodiments of the present disclosure may also be selected to combine with the function of requesting/releasing memory in the DRAM, so that the refresh operation may be performed with a higher accuracy.

Based on the foregoing idea, with regard to FIG. 3, it is assumed that the first state is that data 1 is stored in the first flag bit, and the second state is that data 0 is stored in the first flag bit. Two specific implementations of the refresh method are provided below.

In the first specific implementation, as shown in FIG. 3 and FIG. 12A, the method may include the following operations.

In S311, a storage row $Row_i$ is accessed.

In S312, it is determined whether the number of consecutive accesses to the storage row $Row_i$ within a unit time is greater than a preset threshold.

For the operation in S312, in response to the determination result being yes, the operation in S313 is performed.

It is to be noted that, during power-on initialization of the semiconductor memory, data 0 is written into both the main storage area and the mark storage area. In such case, data 1 has not been written into all memory cells in the main storage area, and all the storage rows have not been subjected to the row hammer, so that all the first flag bits in the mark storage area are in the second state.

During the operation of the semiconductor memory, the number of consecutive accesses to the storage row $Row_i$ within the unit time is accumulated to determine whether the storage row $Row_i$ is a storage row in the row hammer event. Here, the storage row $Row_i$ refers to any one of the storage rows in FIG. 3, and the flag bit $Row_iCol_m$ refers to a first flag bit formed by the storage row $Row_i$ and the bit line $Col_m$.

Exemplarily, the operation of receiving the word line activation instruction Active for the storage row $Row_i$ is regarded as "accessing the storage row Rowi".

In S313, the first flag bit $Row_iCol_m$ corresponding to the storage row $Row_i$ is adjusted to the first state.

It is to be noted that the first flag bit $Row_iCol_m$ is adjusted to the first state by writing data 1 to the flag bit $Row_iCol_m$.

Figure 12B:
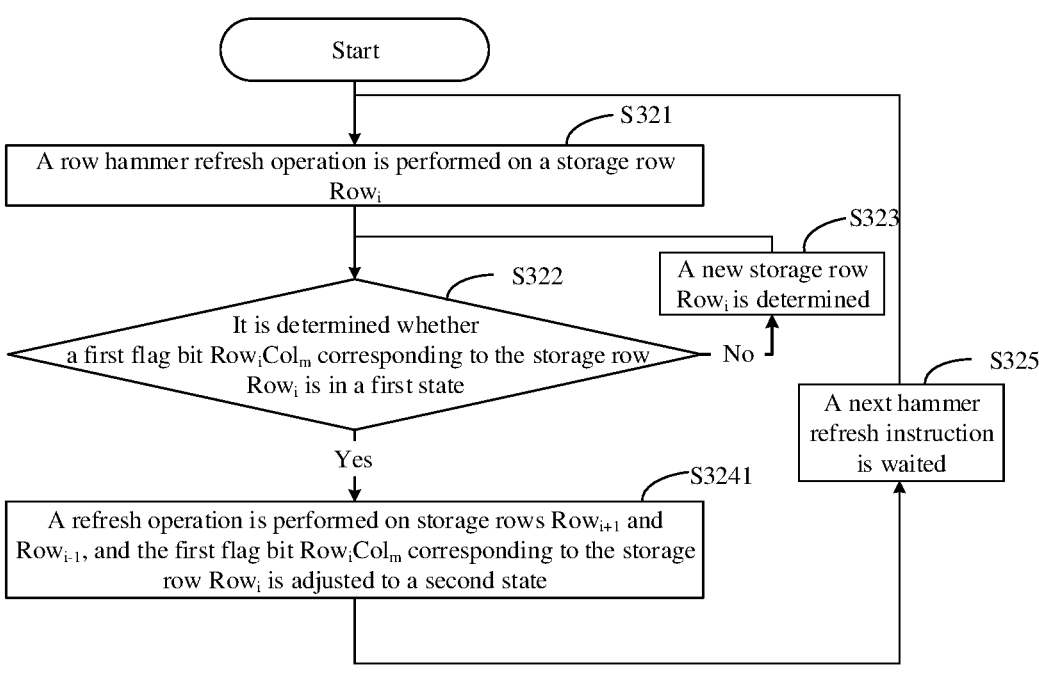
FIG. 12B is a seventh schematic flowchart of a refresh method according to an embodiment of the present disclosure.

As shown in FIG. 3 and FIG. 12B, the method also includes the following operations.

In S321, a row hammer refresh operation is performed on the storage row $Row_i$.

It is to be noted that when it is determined that the row hammer event occurs, a target storage row is randomly selected from the storage bank as a refresh object, and the selected refresh object is marked as the storage row $Row_i$ herein.

It is to be understood that the operation in S321 and the operation in S311 do not have a specific execution order.

In S322, it is determined whether the first flag bit $Row_i$-$Col_m$ corresponding to the storage row $Row_i$ is in the first state.

For the operation in S322, in response to the determination result being no, the operation in S323 is performed. In response to the determination result being yes, the operation in S3241 is performed.

In S323, a new storage row $Row_i$ is determined, and the processing returns to and performs the operation in S322.

It is to be noted that, in response to data 0 being stored in the first flag bit $Row_iCol_m$, a new storage row $Row_i$ is determined until data 1 is stored in a first flag bit of a certain storage row.

In S3241, a refresh operation is performed on the storage rows $Row_{i+1}$ and $Row_{i-1}$, and the first flag bit $Row_iCol_m$ corresponding to the storage row $Row_i$ is adjusted to the second state.

It is to be noted that data 0 is written to the first flag bit $Row_iCol_m$ after the refresh operation is performed on the adjacent storage rows $Row_{i+1}$ and $Row_{i-1}$.

In S325, a next hammer refresh instruction is waited.

Figure 12C:
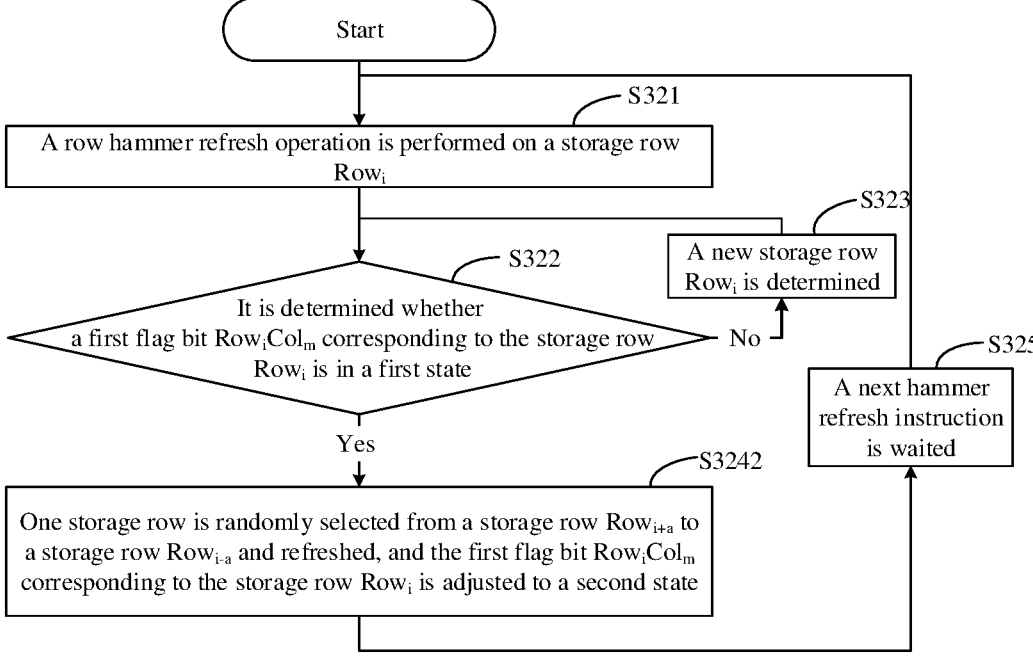
FIG. 12C is an eighth schematic flowchart of a refresh method according to an embodiment of the present disclosure.

In another specific embodiment, as shown in FIG. 12C, for the operation in S322, in response to the determination result being yes, the operation in S3242 may also be performed.

In S3242, one storage row is randomly selected from the storage row $Row_{i+a}$ to the storage row $Row_{i-a}$ and refreshed, and the first flag bit $Row_iCol_m$ corresponding to the storage row $Row_i$ is adjusted to the second state.

In this way, the power consumption of hammer refresh may be greatly reduced.

In another specific embodiment, for the operation in S322, in response to the determination result being no, which may also be regarded as stopping the hammer refresh instruction, the operation in S325 is directly performed. In this way, the refresh operation may not be performed for the received refresh instruction.

To sum up, the embodiments of the present disclosure provide a hammer refresh operation method, which is applied to the semiconductor memory provided with a mark storage area. The aggressor row in the row hammer event may be accurately located through the first flag bit, so as to improve the handling effect of the row hammer event and reduce the power consumption. In addition, it may be determined explicitly through the second flag bit whether the adjacent storage rows of the aggressor row are occupied, and then determined whether to perform the refresh operation on the adjacent storage rows, thereby saving the power consumption.

Figure 13:
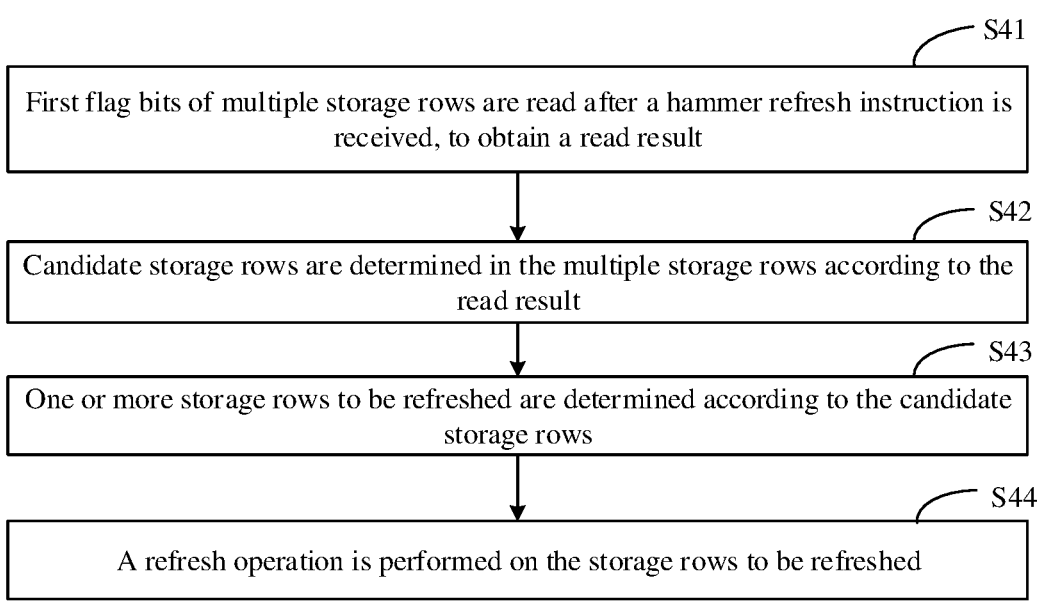
FIG. 13 is a first schematic flowchart of another refresh method according to an embodiment of the present disclosure.

In another embodiment of the present disclosure, FIG. 13 illustrates a schematic flowchart of a refresh method according to an embodiment of the present disclosure. As shown in FIG. 13, the method may include the following operations.

In S41, first flag bits of multiple storage rows are read after a hammer refresh instruction is received, to obtain a read result.

In S42, candidate storage rows are determined in the multiple storage rows according to the read result.

In S43, one or more storage rows to be refreshed are determined according to the candidate storage rows.

In S44, a refresh operation is performed on the storage rows to be refreshed.

It is to be noted that, the refresh method according to the embodiment of the present disclosure is applied to the semiconductor memory including multiple storage rows and multiple first flag bits. One first flag bit has a correspondence with one storage row, and the first flag bit is used for indicating whether one storage row is an aggressor row of a row hammer event, which can be specifically referred to FIG. 2 or FIG. 3.

It is to be noted that there is no limit to the number of storage rows to be refreshed, which may be one or more. Herein, the definition of adjacent storage rows may make reference to the above description, and the number of adjacent storage rows may be one or more.

In this way, the embodiments of the present disclosure provide a row hammer refresh method with low power consumption. After the hammer refresh instruction is received, one or more victim rows of the row hammer event may be screened according to the first flag bit of the storage row, and then the refresh operation may be performed, so that the handling effect of the row hammer event is improved and power consumption is reduced.

In some embodiments, each candidate storage row refers to an aggressor row in the row hammer event. Therefore, the refresh object needs to be selected in the adjacent storage rows of the candidate storage rows.

Figure 14:
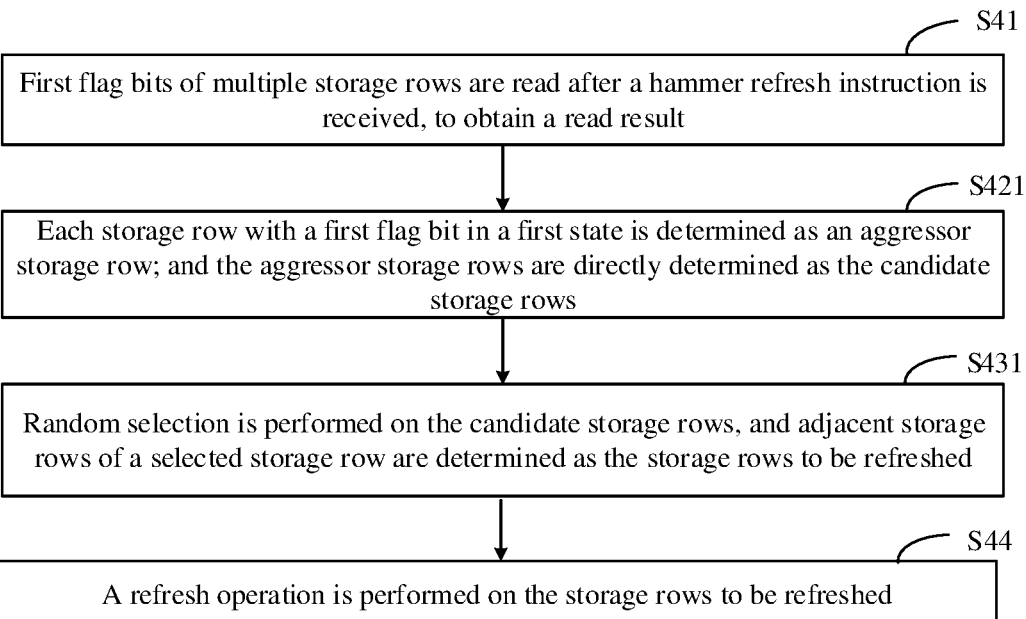
FIG. 14 is a second schematic flowchart of another refresh method according to an embodiment of the present disclosure.

Correspondingly, as shown in FIG. 14, the operation in S42 may specifically include the following operations.

In S421, each storage row with a first flag bit in a first state is determined as an aggressor storage row; and the aggressor storage row is directly determined as the candidate storage rows.

The operation in S43 may specifically include the following operation.

In S431, random selection is performed on the candidate storage rows, and adjacent storage rows of a selected storage row are determined as the storage rows to be refreshed.

In other embodiments, each candidate storage row refers to a victim row in the row hammer event. Therefore, the refresh object may be directly selected in the candidate storage rows.

Correspondingly, as shown in FIG. 15, the operation in S42 may specifically include the following operation.

In S422, each storage row with a first flag bit in a first state is determined as an aggressor storage row, and adjacent storage rows of the aggressor storage row are determined as the candidate storage rows.

The operation in S43 may specifically include the following operation.

In S432, random selection is performed on the candidate storage rows to obtain the storage rows to be refreshed.

In this way, the storage rows may be screened through the first flag bit, thereby reducing the range of effective refresh objects and improving the handling effect of the row hammer event.

As shown in FIG. 4 to FIG. 6, the semiconductor memory also includes second flag bits, the multiple storage rows are divided into multiple storage groups, and one second flag bit has a correspondence with one storage group. The second flag bit is at least used for indicating whether at least one memory cell in one of the storage groups is in a specific state, and the specific state includes an occupancy state.

Thus, in some embodiments, as shown in FIG. 16, after the operation in S43, the method may also include the following operations.

In S45, a second flag bit of a storage group including the storage rows to be refreshed is read.

For the operation in S45, in response to the second flag bit being in a third state, the operation in S44 is performed. In response to the second flag bit being in a fourth state, the operation in S461 is performed.

In S44, the refresh operation is performed on the storage rows to be refreshed.

In S461, no refresh operation is performed on the storage rows to be refreshed, and execution of the hammer refresh instruction is stopped.

Figure 17:
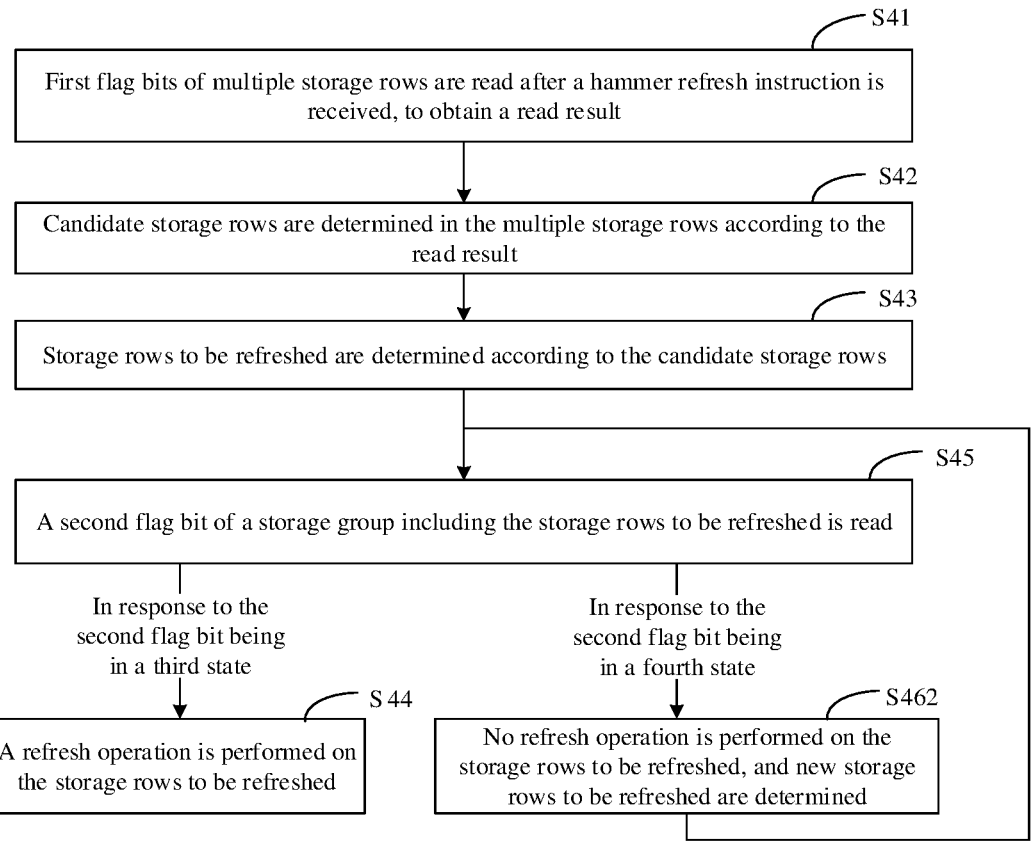
FIG. 17 is a fifth schematic flowchart of another refresh method according to an embodiment of the present disclosure.

In other embodiments, as shown in FIG. 17, for the operation in S45, in response to the second flag bit being in the fourth state, the operation in S462 may also be selected to be performed.

In S462, no refresh operation is performed on the storage rows to be refreshed, new storage rows to be refreshed are determined, and the processing returns to and performs the operation in S45.

In this way, when the second flag bit is in the third state, it indicates that the storage rows to be refreshed may be occupied, and the refresh operation needs to be performed on the storage rows to be refreshed. When the second flag bit is in the fourth state, it indicates that the storage rows to be refreshed must not be occupied, and no refresh operation needs to be performed on the storage rows to be refreshed, thereby saving the power consumption. Similarly, in a case where no refresh operation is performed on the storage rows to be refreshed, there may be at least two different processing mechanisms: (1) waiting, referring to the operation in S461; (2) skipping, referring to the operation in S462.

When each candidate storage row is a victim row in the row hammer event, for the "skipping" mechanism, the new storage rows to be refreshed may be determined by performing random selection in the remaining candidate storage rows. When each candidate storage row is an aggressor row in the row hammer event, and the adjacent storage rows are all rows from the (a+i)th storage row to the (a−i)th storage row, for the "skipping" mechanism, the new storage rows to be refreshed may be adjacent storage rows of the remaining candidate storage rows selected randomly. When each candidate storage row is the aggressor row in the row hammer event, and the adjacent storage row is one row random selected from the (a+i)th storage row to the (a−i)th storage row, for the "skipping" mechanism, the new storage rows to be refreshed may be determined from the (a+i)th storage row to the (a−i)th storage row by performing random selection again. When the second flag bits of all storage rows from the (a+i)th storage row to the (a−i)th storage row are in the fourth state, the new storage rows to be refreshed may be the adjacent storage rows of the remaining candidate storage rows selected randomly.

It is to be noted that when the candidate storage rows are victim rows of the row hammer event, the candidate storage rows may also be screened again according to the second flag bit to determine the occupied victim row, and then the refresh operation is performed. Correspondingly, in some embodiments, as shown in FIG. 18, the operation in S43 may specifically include the following operations.

In S4331, a second flag bit of a storage group including the candidate storage rows is read.

In S4332, in response to the second flag bit being in a third state, the candidate storage rows are determined as secondary candidate storage rows.

In S4333, random selection is performed on the secondary candidate storage rows to obtain the storage rows to be refreshed.

In this way, the second flag bit is used for further reducing the range of candidate storage rows, that is, the secondary candidate storage rows refer to the storage rows that are "victim rows of the row hammer event" and "occupied". Therefore, one row selected from the secondary candidate rows randomly are refreshed directly.

To sum up, the embodiments of the present disclosure provide a hammer refresh operation method, which is applied to the semiconductor memory provided with a mark storage area. The aggressor row in the row hammer event may be accurately located through the first flag bit, so as to improve the handling effect of the row hammer event and reduce the power consumption. Further, it may be determined explicitly through the second flag bit whether the adjacent storage rows of the aggressor row are occupied, and then determined whether to perform the refresh operation on the adjacent storage rows, thereby saving the power consumption.

In another embodiment of the present disclosure, FIG. 19 illustrates a schematic structural diagram of an electronic device 50 according to an embodiment of the present disclosure. As shown in FIG. 19, the electronic device 50 may include the semiconductor memory 10 described above.

In the embodiments of the present disclosure, the semiconductor memory 10 may be a DRAM chip.

The embodiments of the present disclosure provide an electronic device 50, which includes the semiconductor memory 10, and a mark storage area is added in the semiconductor memory 10. The aggressor row of the row hammer event may be located accurately by the first flag bit, so that handling effect of the row hammer event is improved and power consumption is reduced.

The above are merely the preferred embodiments of the present disclosure and are not intended to limit the scope of the present disclosure.

It should be noted that in the present disclosure, terms "include" and "contain" or any other variation thereof are intended to cover nonexclusive inclusions, so that a process, method, object or device including a series of elements not only includes those elements but also includes other elements which are not clearly listed or further includes elements intrinsic to the process, the method, the object or the device. Under the condition of no more limitations, an element defined by the statement "including a/an . . . " does not exclude existence of the same other elements in a process, method, object or device including the element.

The sequence numbers of the embodiments of the disclosure are adopted not to represent superiority-inferiority of the embodiments but only for description.

The methods disclosed in some method embodiments provided in the disclosure may be freely combined without conflicts to obtain new method embodiments.

The features disclosed in some product embodiments provided in the disclosure may be freely combined without conflicts to obtain new product embodiments.

The features disclosed in some method or device embodiments provided in the disclosure may be freely combined without conflicts to obtain new method embodiments or device embodiments.

The above is only the specific implementation of the disclosure and not intended to limit the scope of protection of the disclosure. Any variations or replacements apparent to those skilled in the art within the technical scope disclosed by the disclosure shall fall within the scope of protection of the disclosure. Therefore, the scope of protection of the disclosure shall be subject to the scope of protection of the claims.

The embodiments of the present disclosure provide a semiconductor memory, a refresh method and an electronic device. The semiconductor memory includes a main storage area and a mark storage area, multiple storage rows are arranged in the main storage area, and multiple first flag bits are arranged in the mark storage area. Each storage row has a correspondence with one first flag bit, and the first flag bit is used for indicating whether the storage row is an aggressor row of a row hammer event. In this way, since the mark storage area is added in the semiconductor memory, an aggressor row of the row hammer event may be marked by the first flag bit to determine the attacked object of the row hammer, so that the handling effect of the row hammer event is improved and power consumption is reduced.

The invention claimed is:

1. A semiconductor memory, comprising: a main storage area and a mark storage area, a plurality of storage rows being arranged in the main storage area, and a plurality of first flag bits being arranged in the mark storage area, wherein each storage row has a correspondence with one first flag bit, and the first flag bit is used for indicating whether the storage row is an aggressor row of a row hammer event;

wherein the plurality of storage rows are divided into a plurality of storage groups, and a plurality of second flag bits are further arranged in the mark storage area;

each storage group has a correspondence with one second flag bit, and the second flag bit is at least used for indicating whether at least one memory cell in the storage group has a specific state, the specific state comprising an occupancy state.

2. The semiconductor memory of claim 1, wherein a portion of the storage row extending to the mark storage area is used for forming a first flag bit corresponding to the storage row;

wherein the first flag bit occupies a memory cell.

3. The semiconductor memory of claim 1, wherein the semiconductor memory is configured to:

adjust, in response to monitoring that a number of consecutive accesses to a storage row within a unit time exceeds a preset threshold, a first flag bit of the storage row to a first state; or, adjust, after performing a refresh operation on adjacent storage rows of the storage row, the first flag bit of the storage row to a second state, and reaccumulate the number of consecutive accesses to the storage row within the unit time.

4. The semiconductor memory of claim 1, wherein each storage group comprises one storage row, and a portion of the storage row extending to the mark storage area is used for forming a second flag bit corresponding to the storage group; or each storage group comprises a plurality of storage rows, and a portion of one of the storage rows extending to the mark storage area is used for forming a second flag bit corresponding to the storage group.

5. The semiconductor memory of claim 1, wherein the semiconductor memory is further configured to:

adjust, after receiving a memory allocation instruction for a memory cell, a second flag bit of a storage group comprising the memory cell to a third state; or, adjust, after receiving a memory release instruction for the storage group, the second flag bit of the storage group to a fourth state; or, adjust, after performing a refresh operation on the storage group, the second flag bit of the storage group to the fourth state;

wherein the memory allocation instruction is a word line activation instruction or constructed by using a first reserved code in a memory controller, and the memory release instruction is constructed by using a second reserved code in the memory controller.

6. An electronic device, at least comprising the semiconductor memory of claim 1.

7. The electronic device of claim 6, wherein the semiconductor memory is a Dynamic Random Access Memory (DRAM) chip.

* * * * *